United States Patent [19]

Peters

[11] Patent Number: 5,095,263
[45] Date of Patent: Mar. 10, 1992

[54] ANTI-ALIASING FOR FREQUENCY OUTPUT SENSORS

[75] Inventor: Rex B. Peters, Woodinville, Wash.

[73] Assignee: Sundstrand Data Control, Inc., Redmond, Wash.

[21] Appl. No.: 535,746

[22] Filed: Jun. 11, 1990

[51] Int. Cl.$^5$ .............................................. G01P 3/52
[52] U.S. Cl. ................... 324/78 F; 324/166; 324/207.15; 377/19; 73/518
[58] Field of Search .............. 324/78 F, 174, 166, 324/207.14, 207.15, 207.16, 239, 234; 377/19, 43; 328/127; 73/518

[56] References Cited

U.S. PATENT DOCUMENTS

| | | | |
|---|---|---|---|
| 4,199,719 | 4/1980 | Grob | 324/166 |
| 4,262,251 | 4/1981 | Fujishiro | 324/167 |
| 4,331,917 | 5/1982 | Render | 324/166 |
| 4,341,996 | 7/1987 | Coffman | 324/166 |
| 4,383,303 | 5/1983 | Hoffman | 324/166 |
| 4,647,853 | 3/1987 | Cobern | 324/167 |

Primary Examiner—Kenneth A. Wieder
Assistant Examiner—Jose M. Solis
Attorney, Agent, or Firm—Christensen, O'Connor, Johnson & Kindness

[57] ABSTRACT

A technique for reducing the effects of aliasing in a frequency output sensor system. The system includes a sensor for producing a sensor output signal at a frequency that varies within a modulation range as a function of an input parameter. The system also includes a processor for measuring the frequency of the sensor output signal at a sequence of sample times. The invention provides an analog filter for filtering the sensor output signal. In a first embodiment, the filter has an increasing phase lag versus frequency characteristic within the modulation range. In a second embodiment, the filter comprises a phase lock loop having frequency dividers in the input signal path and in the feedback path.

8 Claims, 3 Drawing Sheets

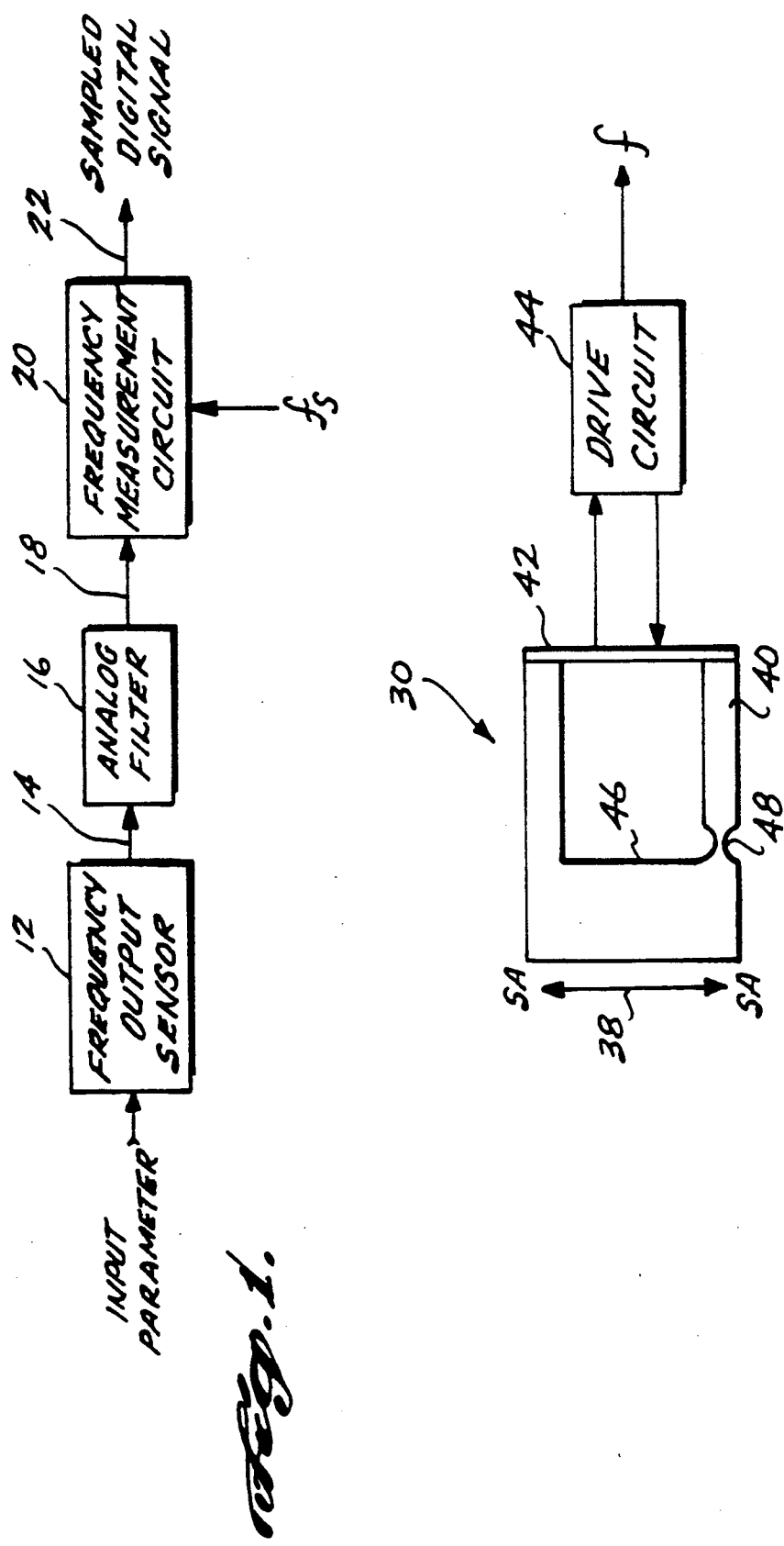

ANTI-ALIASING FOR FREQUENCY OUTPUT SENSORS

FIELD OF THE INVENTION

The present invention relates to frequency output sensors, i.e., to sensors in which an input parameter is encoded as the frequency of an output signal. Well known examples of such sensors include accelerometers, pressure sensors and force sensors.

BACKGROUND OF THE INVENTION

In one type of frequency output sensor, a force is converted to a frequency by a vibrating beam force sensing element. The force sensing element is coupled to a drive circuit that causes the force sensing element to vibrate at its resonant frequency. A tension force on the force sensing element causes its resonant frequency to rise, while a compression force on the force sensing element causes its resonant frequency to decrease. The force sensing element can therefore be operated as a force-to-frequency converter that frequency modulates an information signal onto a carrier signal, the carrier signal being the zero load resonant frequency of the force sensing element. A significant advantage of frequency output sensors is the fact that their output signals are inherently digital, and may therefore be conveniently integrated into a microprocessor-based system.

The output signal of a frequency output sensor may be demodulated by counting the number of cycles of the output signal that occur in each of a series of sampling intervals. For each sampling interval, the average frequency during that sampling interval is determined by dividing the number of cycles by the length of the sampling interval. Systems of this type sample a continuously variable quantity (frequency) at a sequence of sampling times. Such systems are therefore susceptible to aliasing of high frequency inputs, e.g., high frequency forces such as vibrations, when the frequency of such inputs exceeds the Nyquist frequency that is equal to half of the sampling frequency.

The aliasing problem can be better appreciated by considering the specific example of a vibrating beam accelerometer. In such an instrument, acceleration along the instrument's sensitive axis causes a compression or tension force on a vibrating beam force sensing element. Such an instrument may have a mechanical resonance in the range 1200–3000 Hz, and may have its output signal sampled at a rate on the order of 400 Hz. As a result, if the structure to which the accelerometer is attached vibrates at or near the frequency of the mechanical resonance, the vibration will be aliased into the sensor's bandwidth.

Such aliasing may not significantly degrade the performance of the accelerometer for certain applications, such as navigation systems. This is due to the fact that it is an inherent property of such a sensor that no vibrations will alias to DC (i.e., zero Hz), because the sensor has no frequency response at multiples of the sampling frequency. Furthermore, aliased components at frequencies other than DC may have little effect, because such signals average out when the acceleration is integrated to determine velocity and position. However, when a frequency output accelerometer is used in an autopilot, for example, such aliasing has the potential for causing spurious steering commands at low frequencies (within the instrument's bandwidth), thereby reducing aerodynamic efficiency and increasing autopilot power consumption.

The normal digital system practice to minimize the effects of aliasing is to use analog filters before sampling, to attenuate high frequencies to an acceptable level. However, in a frequency output accelerometer, there is direct mechanical conversion of the input acceleration into a frequency output. Therefore, to prevent or minimize aliasing, one is limited either to mechanical filtering, so that high frequency vibrations do not reach the accelerometer, or to the use of digital filtering after the sampling process. Mechanical filtering, such as with mechanical isolators, has the disadvantage that the isolator increases the size of the components making up the system. In addition, mechanical isolators have poor dimensional stability, and are subject to aging effects. The use of digital filtering after sampling generally requires a very high sampling rate, and therefore imposes large throughput requirements on the digital processing system.

In an FM communications system, filtering to reduce bandwidth can be performed on the information signal either prior to modulation in the transmitter, or after demodulation in the receiver. Such filtering is performed in a conventional way in the amplitude domain, i.e., the signal being filtered is one in which the information is encoded as the amplitude of a waveform with respect to a zero or reference level. Such filtering is distinct from the filtering of a frequency domain signal, i.e., a signal in which the information is encoded as the frequency of the signal with respect to a referenced frequency. It is known from FM communications systems theory that the frequency spectrum of an FM signal comprises a central peak, corresponding to the carrier frequency, and side bands that represent the information carried by the signal. In such communications systems, a possible technique for limiting the bandwidth of the system is to pass the FM signal through a band-pass filter that symmetrically attenuates frequencies beyond a certain distance from the carrier. However, it is also known that such a process produces a nonlinear effect on the frequency components carried by the signal. While such nonlinearities could be unimportant in some FM systems, they would significantly degrade the accuracy of a frequency output sensor. There is therefore a need for an anti-aliasing technique for frequency output sensors that does not introduce nonlinearities, and that does not require mechanical isolators or very high sampling rates.

SUMMARY OF THE INVENTION

The present invention provides a novel technique for reducing the effects of aliasing in a frequency output sensor system. Such a system includes sensor means for producing a sensor output signal at a frequency that varies within a modulation range as a function of an input parameter. The system also includes processing means for measuring the frequency of the sensor output signal at a sequence of sample times.

The improvement to which the invention is directed comprises an analog filter for filtering the sensor output signal. In a first preferred embodiment, the filter is characterized by an increasing phase lag versus frequency characteristic within the modulation range. The filter may be implemented by a low pass filter having a phase lag versus frequency characteristic that is substantially linear within the modulation range, and a 3dB point at the center of such range. In a second preferred embodiment, the analog filter comprises a phase lock loop having frequency dividers in the input signal path and in the feedback path. As a result of the frequency dividers, the phase comparator of the phase lock loop compares the phase of signals having relatively low frequencies, so that a useful filtration effect is obtained without losing lock.

BRIEF DESCRIPTION OF THE DRAWINGS

FIG. 1 is a block diagram of a system according to the present invention.

FIG. 2 is a schematic diagram of a frequency output accelerometer.

DETAILED DESCRIPTION OF THE INVENTION

Figure 3:
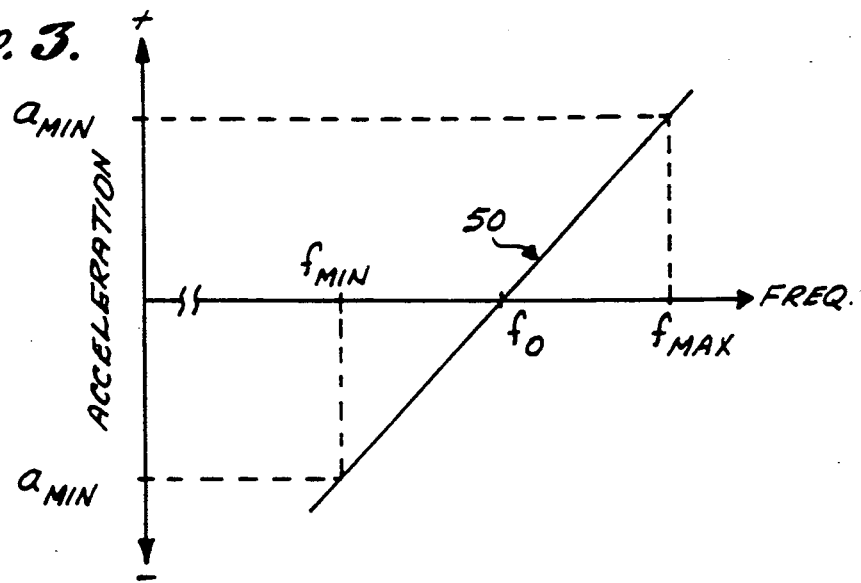
FIG. 3 is a graph showing the acceleration to frequency characteristic of the accelerometer of FIG. 2.

FIG. 1 illustrates a generalized embodiment of the present invention. The illustrated system comprises frequency output sensor 12 that senses an input parameter of the type that the sensor is designed to detect, and that produces sensor output signal 14. The sensor output signal is an analog signal having a frequency that corresponds to the value of the input parameter. The sensor output signal is received by analog filter 16 that filters the sensor output signal to produce filtered signal 18. The filtered signal is then input to digital frequency measurement circuit 20.

Circuit 20 samples the frequency of the filtered signal at a sampling rate $f_s$, to produce a sampled digital signal on line 22 that represents the value of the input parameter over time. Circuit 20 therefore performs a demodulation function. The frequency measurement technique involves counting the number of cycles (i.e., the phase change) of the filtered signal that occur between successive sampling times. Suitable techniques of this type are described in U.S. Pat. No. 4,786,861. In general, it will be found desirable to make use of a limiter within digital frequency measurement circuit 20 prior to counting, to improve accuracy.

For the purpose of illustrating and explaining the invention, it will be assumed that frequency output sensor 12 comprises an accelerometer of the type that includes a vibrating beam force transducer. The construction and operation of such a device is shown in FIGS. 2 and 3. FIG. 2 illustrates schematically accelerometer 30 for measuring acceleration along a sensitive axis SA. The accelerometer comprises proof mass 40, force sensing element 42, drive circuit 44 and support 46. The force sensing element comprises a quartz crystal having a double-ended tuning fork construction, of the type illustrated in U.S. Pat. No. 4,215,570. Drive circuit 44 causes the force sensing element to vibrate at a particular resonant frequency f, and the output of drive circuit 44 is the sensor output signal at such frequency. Proof mass 40 is mounted to support 46 by flexure hinge 48, or by any other suitable means, the flexure hinge permitting motion of the proof mass about an axis that passes through the flexure hinge, and that is perpendicular to the plane of the drawing in FIG. 2.

Force sensing element 42 is aligned parallel to sensitive axis 38, and has one end attached to support 46 and the second end attached to proof mass 40. The proof mass is thereby suspended at one end by the flexure hinge and at its other end by the force sensing element. An acceleration along sensitive axis SA causes proof mass 40 to move slightly along the sensitive axis, thereby exerting a tension or compression force on the force sensing element. The tension or compression force will cause the resonant frequency f of the force sensing element to increase or decrease, respectively. The force sensing element therefore operates as a force-to-frequency convertor that frequency modulates an acceleration signal onto a carrier signal, the carrier signal being the zero acceleration resonant frequency of the force sensing element.

FIG. 3 schematically illustrates the acceleration-to-frequency characteristic 50 of accelerometer 30. In the absence of an acceleration along sensitive axis SA, no force is exerted on force transducer 42, and the frequency of the sensor output signal is the force transducer's zero load frequency $f_o$. Acceleration in the upward (here taken to be positive) direction along the sensitive axis results in a tension force on force transducer 42, thereby increasing the frequency of the sensor output signal. Similarly, a downward (negative) acceleration produces a decrease in the sensor output signal frequency. At the full-scale inputs of $a_{max}$ and $a_{min}$, the sensor output signal frequencies are $f_{max}$ and $f_{min}$, respectively. The frequency range from $f_{min}$ to $f_{max}$ will be referred to herein as the modulation range or full-scale range of the sensor. Although force-to-frequency characteristic 50 is illustrated as a linear relationship, in practice, there are small departures from linearity that result from nonlinearities in the force-to-frequency characteristics of force transducer 42.

Figure 4:
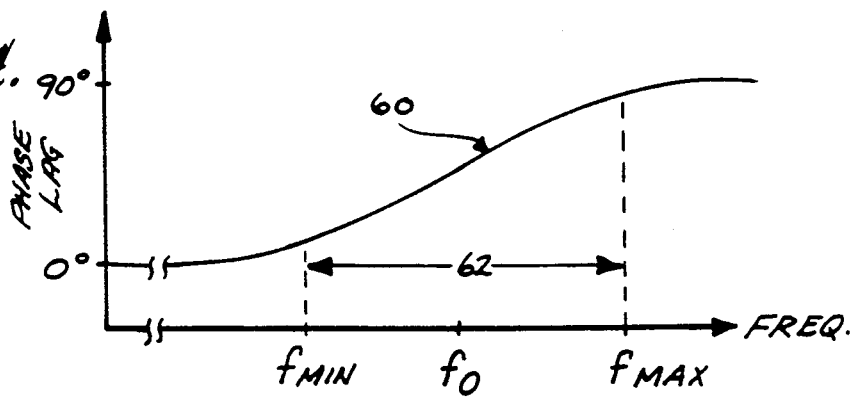
FIG. 4 is a graph showing the phase lag characteristic of the analog filter.

It has been found that if analog filter 16, shown in FIG. 1, has a suitable phase characteristic, then the analog filter will reduce the bandwidth of the information signal carried by sensor output signal 14, and thereby reduce the aliasing problem. The necessary phase characteristic is that the phase lag (vs. frequency) characteristic of the analog filter be increasing within the modulation range of the sensor output signal. By way of example, FIG. 4 shows the phase lag characteristic 60 of a suitable analog filter. Phase lag here means the amount by which the phase of signal 18 at the output of the filter lags the phase of signal 14 at the input of the filter. As illustrated, phase lag characteristic 60 increases with increasing frequency within modulation range 62, thereby producing a filtering action that will have the desired effect of reducing the bandwidth of the information signal produced by frequency output sensor 12.

Figure 5:
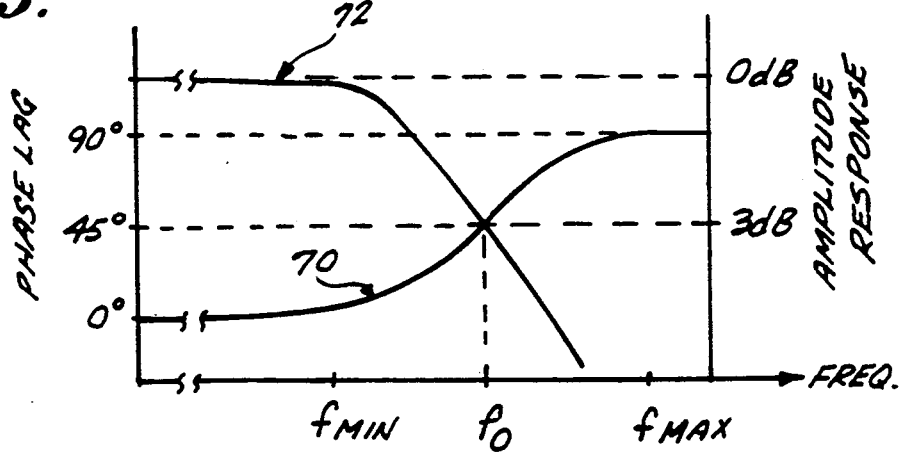
FIG. 5 is a graph showing the phase lag and amplitude response characteristics of the analog filter.

The most straightforward implementation of analog filter 16 is a low pass filter having its corner frequency at or near the center of the modulation range, i.e., at or near zero load frequency $f_o$. The corner frequency of a low pass filter is the frequency at which the amplitude response has dropped by 3dB. FIG. 5 illustrates the phase lag characteristic 70 and amplitude response 72 of a first order low pass filter. If the 3dB point of amplitude response 72 is at the zero load frequency $f_o$, then $f_o$ will be located at the central and most linear portion of phase lag characteristic 72, i.e., the point at which the phase lag has the intermediate value of 45° for the illustrated first order filter. For higher order filters, the phase lag at the 3dB point will in general be 45n°, where n is the order of the filter. For reasons discussed below, the linearity of phase lag characteristic 70 is a preferred feature of the present invention.

To understand why the filters characterized in FIGS. 4 and 5 have the effect of reducing the bandwidth of the information signal, assume that the signal input to the filter on line 14 is $f_i(t)$, the signal produced by the filter is $f_o(t)$, and that the phase shift produced by the filter is $\Delta(f)$, wherein it is explicitly assumed that the phase shift is a function of the frequency of the input signal. If $\omega(t)$ is the phase of the input signal as a function of time, then $$f_o(t) = \frac{d}{dt}(\Phi(t) + \Delta(f(t))) \tag{1}$$

which can be rearranged to produce $$f_o(t) = f_i(t) + \frac{\partial \Delta}{\partial f} \cdot \frac{df}{dt} \tag{2}$$

The quantity $\partial \Delta / \partial f$ is the slope of phase lag characteristic 60 of the filter. If this quantity is a constant within the modulation range, then Equation 2 reduces to a simple, linear first order differential equation. Furthermore, this equation may be seen to be the frequency analog of a simple, first order low pass filter. Consider for example the filter shown in FIG. 6, where the input signal (voltage) is designated $e_i$ and the output signal is designated $e_o$. The output signal $e_o$ may be expressed as $$e_o = \frac{1}{C} \int_0^t \frac{e_i - e_o}{R} dt \tag{3}$$

which can be rearranged to produce $$e_i = e_o + RC \frac{de_o}{dt} \tag{4}$$

Comparing equations 2 and 4, it may be seen that if the unlabeled frequency in Equation 2 is assumed to be $f_o$, and if $$\frac{\partial \Delta}{\partial f} = -RC \tag{5}$$

then the filtering operation of Equation 2 is a frequency analog of a first order low pass filter in the amplitude domain.

Figure 6:
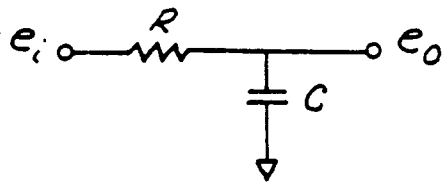
FIG. 6 is a circuit diagram of a simple low pass filter.

For a further comparison, one may look at the ramp response of the filter shown in FIG. 6, and find that "steady state" corresponds to a parallel ramp in the output, delayed by time $T=RC$ with respect to the input signal. Thus if the output signal $e_o$ is given by $$e_o = a_o \sin((1+bt)\omega t) \tag{6}$$

i.e., a ramp in frequency, then in light of Equation 4, one may write $$e_i = a_i \cos\Phi \sin(pt) + a_i \sin\Phi \cos(pt) \tag{7}$$

where $$p = (1 + bt)\omega \tag{8}$$

$$a_i = \frac{a_o \omega RC(1 + bt)}{\sin \Phi} \tag{9}$$

and $$\Phi = \tan^{-1}(\omega RC(1+2bt)) \tag{10}$$

In this example, the output signal ($e_o$) is $a_o \sin(pt)$, and the input signal ($e_i$) is $a_i \sin(pt+\Phi)$, where $\Phi$ is a leading phase in the input signal. The difference in frequency between $e_o$ and $e_i$ is $$\Delta p = \frac{d\Phi}{dt} = \frac{d}{dt}[\tan^{-1}(\omega RC(1 + 2bt))] \tag{11}$$

which can be expanded to produce $$\Delta p = \frac{2b\omega RC}{1 + \omega^2 R^2 C^2(1 + 2bt)^2} \tag{12}$$

In the usual case, in which the quantity 2bt is much less than 1, i.e., in which the frequency deviation is relatively small compared to the center frequency, Equation 12 may be simplified to $$\Delta p = \frac{2b}{\omega RC + \frac{1}{\omega RC}} \tag{13}$$

For fixed values of $\omega$, R and C, this is a constant offset (delay), exactly analogous to the amplitude domain ramp response of a first order filter. Furthermore, the corresponding time delay T is given by $$T = \frac{1}{\omega}\left(\frac{2}{\omega RC + \frac{1}{\omega RC}}\right) \tag{14}$$

Thus T is a constant for the filter, independent of b, also analogous to a first order analog filter. The maximum value of T occurs when $\omega RC$ is equal to 1, the maximum value being equal to RC. The optimum RC filter would therefore be one for which the corner frequency is equal to $\omega$, the zero load frequency of the force transducer.

As described above, if the phase lag characteristic of the analog filter is linear within the modulation range, then the effect of the filter in the frequency domain is linear, i.e., it is governed by a first-order linear differential equation. As a result, when the input acceleration varies at a certain rate, the output of the system will be proportional to the input. However, the use of analog filter 16 will reduce aliasing and be useful even if the phase lag characteristic is not entirely linear, because the number of cycles of the sensor output signal will still be equal to the number of cycles of the filtered signal. Thus nonlinearities will not rectify and produce a DC error. Although the invention has been described above in the context of a single-pole filter, it will be appreciated that higher order analog filters may also be used, so long as they have the appropriate phase lag characteristic within the modulation range.

Figure 7:
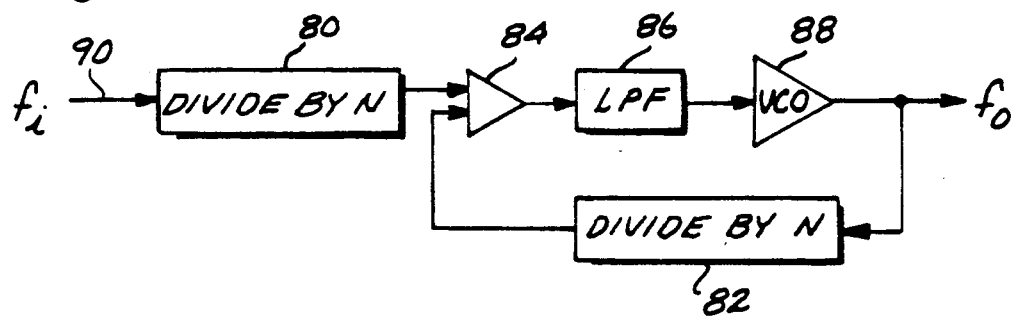
FIG. 7 is a block diagram of a second preferred embodiment for the analog filter utilizing a phase lock loop.

In the embodiment described above, the analog filter comprises a low pass filter, or any other equivalent device, having the appropriate phase lag characteristic. A second preferred embodiment of the analog filter is shown in FIG. 7. This filter circuit comprises divide by N circuits 80 and 82, phase comparator 84, low pass filter (LPF) 86, and voltage controlled oscillator (VCO) 88. Phase comparator 84, LPF 86, VCO 88, and the feedback path from the output of VCO 88 to phase comparator 84 comprise a conventional phase lock loop. However, the input signal on line 90 is first passed through divide by N circuit 80 before being input to phase comparator 84. Similarly, the feedback path from the output of VCO 88 to the other input of phase comparator 84 includes divide by N circuit 82. The output signal $f_o$ is taken from the output terminal of VCO 88.

In a phase lock loop of the general type illustrated in FIG. 7, the phase comparator converts the input FM signal into an amplitude modulated analog signal, and the VCO converts the amplitude modulated signal back to an FM signal. Thus in general, the circuit shown in FIG. 7 produces its filtering effect by converting the FM signal to a conventional analog signal, low pass filtering the analog signal in LPF 86, and then converting back to the frequency domain. However, the problem with using a simple phase lock loop to filter the output of a frequency output sensor is that there is a conflict between the LPF corner frequency required to perform a useful filtering effect, and the corner frequency required to enable the phase lock loop to remain locked to the input signal. In particular, a relatively high corner frequency will be required to keep the phase of the output signal within one-half cycle of the phase of the input signal, to avoid losing the lock. However, because of this relatively high corner frequency, the low pass filter will not perform a useful filtering effect on the signal, i.e., the low pass filter will not have a significant anti-aliasing effect.

In order to overcome this limitation, divide by N circuits 80 and 82 are inserted into the phase lock loop. Thus the two signals input to phase comparator 84 have frequencies that are lower by a factor of N than the frequency of the input and output signals. As a result, a significant phase lag can occur between the output and input signals, without having the phase comparator input signals differing by more than half a cycle. The circuit of FIG. 7 therefore reconciles the requirements of maintaining lock, and performing a useful anti-aliasing function.

One potential advantage of the use of the phase lock loop embodiment as shown in FIG. 7 is that it may be used with a frequency output sensor in which the frequency varies in a single direction from the zero load or zero input frequency. By contrast, the analog filter characterized in FIGS. 4 and 5 can in general be used only when the frequency of the sensor output signal varies in both directions with respect to a central zero load frequency.

A suitable value for N in the embodiment of FIG. 7 can be calculated by considering the effect of a full-scale instantaneous (i.e., step) change in the frequency of the sensor output signal. Suppose, for example, that the frequency of the sensor output signal instantaneously changes from frequency f1 to frequency f2 at time t=0. Further suppose that the frequency of the signal output by the filter $f_o$ is related to the input frequency $f_i$ by a first order low pass filter with time constant T. Thus for times t greater than zero:

$$f_i - f_o = (f_2 - f_1)e^{-t/T} \qquad (15)$$

Equation 15 may be integrated to provide an expression for the phase difference $\Delta\phi$ between the input and output signals:

$$\Delta\phi = (f_2 - f_1)T(1 - e^{-t/T}) \qquad (16)$$

Thus as time is allowed to go to infinity, the total phase difference or phase lag $\Delta\phi$ is $T(f_2 - f_1)$. If the frequency step from $f_1$ to $f_2$ is equal to 10% of $f_1$, then the limiting phase lag will be $0.1Tf_1$.

One can apply these calculations to a specific example of a frequency output accelerometer in which $f_1$ is 36,000 Hz, and in which T is 1/720 seconds, corresponding to a corner frequency of 115 Hz. The maximum phase lag can therefore be determined to be equal to 5 cycles. Since a full-scale step change is about as large a phase shift as one is likely to encounter in practice, 5 cycles is a reasonable upper limit, and a value of N of $\geq 5$ would suffice. Making N equal to 8 would provide an additional margin, and would allow each divide by N circuit to be implemented using a 3-bit shift register.

Figure 8:
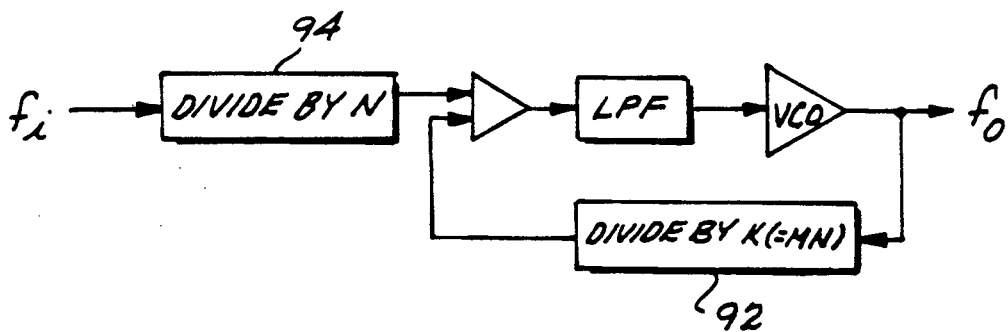
FIG. 8 is a block diagram of a variation of the FIG. 7 embodiment.

A common technique used to aid in sampling frequency modulated signals is to multiply the frequency of the signal to be sampled using a phase lock loop having a divider in the feedback path. When this technique is to be used, anti-aliasing filtration can be accomplished as shown in FIG. 8. This circuit is the same as the circuit shown in FIG. 7, except that divider 92 now divides the feedback signal by the factor K, while divider 94 in the input signal path continues to divide the input signal by the factor N. K is equal to MN, where M is an integer. This circuit therefore produces the described anti-aliasing effects, and also multiplies the output signal $f_o$ by the factor M to aid in the sampling process.

While certain preferred embodiments of the invention have been illustrated and described, variations will be apparent to those skilled in the art. Accordingly, the scope of the invention is to be determined in accordance with the following claims.

The embodiments of the invention in which an exclusive property or privilege is claimed are defined as follows:

1. In a system for measuring an input parameter, the system including sensor means for producing a sensor output signal at a frequency that varies within a modulation range as a function of the input parameter, and processing means for measuring the frequency of the sensor output signal at a sequence of sample times, the improvement comprising an analog filter for filtering the sensor output signal, the filter being connected between the sensor means and the processing means, the filter having an increasing phase lag versus frequency characteristic within the modulation range.

2. The improvement of claim 1, wherein the filter has a low pass amplitude versus frequency characteristic.

3. The improvement of claim 1, wherein the filter has a substantially linear phase lag versus frequency characteristic within the modulation range.

4. The improvement of claim 2, wherein the amplitude versus frequency characteristic has a 3dB point at a frequency approximately in the center of the modulation range.

5. In a system for measuring an input parameter, the system including sensor means for producing a sensor output signal at a frequency that varies within a modulation range as a function of the input parameter, and processing means for measuring the frequency of the sensor output signal at a sequence of sample times, the improvement comprising an analog filter for filtering the sensor output signal, the filter being connected between the sensor means and the processing means, the filter comprising a phase lock loop that includes a phase comparator having first and second input terminals, a low pass filter, a voltage-controlled oscillator having an output terminal, a feedback path coupling the output terminal of the voltage-controlled oscillator to the first input terminal of the phase comparator, a divide by N circuit coupled between the sensor means and the second phase comparator input terminal, and a divide by K circuit in the feedback path, K being greater than or equal to N.

6. The system of claim 5, where K is equal to N.

7. The system of claim 5, where K is equal to MN and M is an integer, whereby the frequency of the sensor output signal is multiplied by M.

8. An anti-aliasing method for a system that includes sensor means for producing a sensor output signal at a frequency that varies within a modulation range as a function of an input parameter, and processing means for measuring the frequency of the sensor output signal at a sequence of sample times, the method comprising analog filtering the sensor output signal by means of a filter that has an increasing phase lag versus frequency characteristic within the modulation range.

* * * * *